US012753503B2

(12) United States Patent
Seo et al.

(10) Patent No.: US 12,753,503 B2
(45) Date of Patent: Oct. 6, 2026

(54) SEMICONDUCTOR PROCESS CHAMBER

(71) Applicant: HANWHA PRECISION MACHINERY CO., LTD., Changwon-si (KR)

(72) Inventors: Dong Won Seo, Seoul (KR); Ju Yeon Kwon, Seoul (KR); Yu Ri Shin, Seoul (KR)

(73) Assignee: HANWHA PRECISION MACHINERY CO., LTD., Changwon-si (KR)

( * ) Notice: Subject to any disclaimer, the term of this patent is extended or adjusted under 35 U.S.C. 154(b) by 672 days.

(21) Appl. No.: 18/205,201

(22) Filed: Jun. 2, 2023

(65) Prior Publication Data

US 2023/0392260 A1 Dec. 7, 2023

(30) Foreign Application Priority Data

Jun. 7, 2022 (KR) ........................ 10-2022-0068815

(51) Int. Cl.
*C23C 16/455* (2006.01)

(52) U.S. Cl.
CPC .... *C23C 16/4557* (2013.01); *C23C 16/45565* (2013.01)

(58) Field of Classification Search
CPC .......... C23C 16/4557; C23C 16/45565; C23C 16/45561; F16L 53/30; H10P 72/0402; H10P 72/0432; H01J 37/3244; H01J 37/32449
USPC ........ 118/715; 156/345.33, 345.34; 219/629, 219/643
See application file for complete search history.

(56) References Cited

U.S. PATENT DOCUMENTS

| | | | | |
|---|---|---|---|---|
| 2003/0084848 | A1* | 5/2003 | Long | H01J 37/3244 118/712 |
| 2006/0096541 | A1 | 5/2006 | Seo et al. | |
| 2012/0009728 | A1* | 1/2012 | Li | C23C 14/0623 438/89 |
| 2013/0062338 | A1* | 3/2013 | Lida | H05B 3/56 219/548 |
| 2016/0146393 | A1* | 5/2016 | Kim | F16L 59/14 219/535 |
| 2020/0182390 | A1* | 6/2020 | Kimoto | F16L 53/38 |
| 2021/0025048 | A1* | 1/2021 | Lerner | C23C 16/45561 |

FOREIGN PATENT DOCUMENTS

| | | |
|---|---|---|
| KR | 10-0629172 B1 | 9/2006 |
| KR | 10-2190416 B1 | 12/2020 |

OTHER PUBLICATIONS

Tianchen Xiao et al; Polym. Bull. (2017) 74:4561-4575.*
Communication issued on Dec. 7, 2023 by the Korean Intellectual Property Office for Korean Patent Application No. 10-2022-0068815.

* cited by examiner

*Primary Examiner* — Rudy Zervigon
(74) *Attorney, Agent, or Firm* — Sughrue Mion, PLLC

(57) ABSTRACT

Provided is a semiconductor process chamber including a chamber configured to accommodate a wafer, and a shower head on an upper side of the chamber and including a plurality of nozzles, wherein the shower head includes a gas supplier configured to supply gas to the shower head, and wherein the gas supplier includes a gas line, a heating jacket adjacent to the gas line, and a heating jacket cover adjacent to the heating jacket.

20 Claims, 13 Drawing Sheets

400

SEMICONDUCTOR PROCESS CHAMBER

CROSS-REFERENCE TO RELATED APPLICATION

This application claims priority to Korean Patent Application No. 10-2022-0068815, filed on Jun. 7, 2022, in the Korean Intellectual Property Office, the disclosure of which is incorporated herein in its entirety by reference.

BACKGROUND

1. Field

Example embodiments of the present disclosure relate to semiconductor process chambers.

2. Description of Related Art

In general, atomic layer deposition (ALD) and chemical vapor deposition (CVD) are thin-film deposition methods for depositing a thin-film on an upper surface of a wafer by supplying a reaction gas to the wafer. The ALD method is a method of adsorbing and depositing a reaction gas on a wafer by alternately supplying and purging the reaction gas on the wafer, and the CVD method is a method of simultaneously spraying a reaction gas to deposit the reaction gas on the wafer.

In the ALD and CVD methods, a gas is supplied into a chamber through a gas line to uniformly spray the gas onto a surface of the wafer. At this time, in order to maintain a temperature of the reaction gas supplied into the chamber through the gas line at an appropriate level, a structure in which the gas line is wrapped in a heating jacket may be employed. The heating jacket may increase the temperature of the gas passing through the gas line to manage the temperature of the reaction gas introduced into the chamber. However, as the heating jacket is heated, not only the temperature of the gas line may increase, but also an external temperature of the gas line and the heating jacket may raise. This may affect electronic devices placed around the gas line, and thus, a problem in which the working environment may deteriorate and the reliability of process equipment is lowered may occur. In addition, because the heat of the heating jacket escapes to the outside of the gas line, a problem in which the thermal efficiency of the heating jacket is significantly reduced may also occur.

SUMMARY

One or more example embodiments provide a semiconductor process chamber capable of preventing deterioration around a gas line while maintaining the thermal efficiency of the gas line.

However, this objective is an example, and the objective of the disclosure is not limited thereto.

Additional aspects will be set forth in part in the description which follows and, in part, will be apparent from the description, or may be learned by practice of the presented embodiments of the disclosure.

According to an aspect of an example embodiment, there is provided a semiconductor process chamber including a chamber configured to accommodate a wafer, and a shower head on an upper side of the chamber and including a plurality of nozzles, wherein the shower head includes a gas supplier configured to supply gas to the shower head, and wherein the gas supplier includes a gas line, a heating jacket adjacent to the gas line, and a heating jacket cover adjacent to the heating jacket.

The heating jacket cover may include a first layer adjacent to the heating jacket, and wherein the first layer may include a heat reflection coating layer.

The shower head may further include a connection portion configured to supply gas supplied from the gas supplier to a nozzle supplier, the gas supplier may be connected to the connection portion, and the first layer may be adjacent to a portion of the heating jacket connected to the connection portion.

The shower head may further include a connection portion configured to supply gas supplied from the gas supplier to a nozzle supplier, the gas supplier may be connected to the connection portion, and a thickness of the first layer may increase in a direction toward the connection portion.

A thickness of the heat reflection coating layer may be less than or equal to 10% of a thickness of the heating jacket.

The heating jacket cover may include a second layer adjacent to the heating jacket, and the second layer may include an air pocket layer.

The shower head may further include a connection portion configured to supply gas supplied from the gas supplier to a nozzle supplier, the gas supplier may be connected to the connection portion, and the second layer may be adjacent to a portion of the heating jacket connected to the connection portion.

The shower head may further include a connection portion configured to supply gas supplied from the gas supplier to a nozzle supplier, the gas supplier may be connected to the connection portion, and a thickness of the second layer may increase in a direction toward the connection portion.

A thickness of the air pocket layer may be greater than or equal to 20% or and less than or equal to 50% of a thickness of the heating jacket.

The heating jacket cover may include a first layer adjacent to the heating jacket, and a second layer adjacent to the first layer, wherein the first layer includes a heat reflection coating layer, and the second layer includes an air pocket layer.

The shower head may further include a connection portion configured to supply gas supplied from the gas supplier to a nozzle supplier, the gas supplier may be connected to the connection portion, and the first layer and the second layer may be adjacent to a portion of the heating jacket connected to the connection portion.

The shower head may further include a connection portion configured to supply gas supplied from the gas supplier to a nozzle supplier, the gas supplier may be connected to the connection portion, and a thickness of the first layer and a thickness of the second layer may increase in a direction toward the connection portion.

The semiconductor process chamber may further include a gas line cover between the heating jacket and the gas line.

The gas line cover may include an aluminum block.

The heating jacket may include a heating wire and rubber material or a textured material.

According to another aspect of an example embodiment, there is provided a semiconductor process chamber including a chamber configured to accommodate a wafer, and a shower head on an upper side of the chamber and including a plurality of nozzles, wherein the shower head includes a gas supplier configured to supply gas to the shower head, wherein the gas supplier includes a gas line, a heating jacket adjacent to the gas line, and a heating jacket cover adjacent to the heating jacket, and the heating jacket cover includes a first layer adjacent to the heating jacket, and a second layer adjacent to the first layer.

The first layer may include a heat reflection coating layer, and the second layer may include an air pocket layer.

The shower head may further include a connection portion configured to supply gas supplied from the gas supplier to a nozzle supplier, the gas supplier may be connected to the connection portion, and the first layer and the second layer may be adjacent to a portion of the heating jacket connected to the connection portion.

The shower head may further include a connection portion configured to supply gas supplied from the gas supplier to a nozzle supplier, the gas supplier may be connected to the connection portion, and a thickness of the first layer and a thickness of the second layer may increase in a direction toward the connection portion.

A thickness of the air pocket layer may be greater than or equal to 20% or and less than or equal to 50% of a thickness of the heating jacket.

BRIEF DESCRIPTION OF DRAWINGS

The above and other aspects, features, and advantages of example embodiments of the disclosure will be more apparent from the following description taken in conjunction with the accompanying drawings, in which.

DETAILED DESCRIPTION

Figure 1:
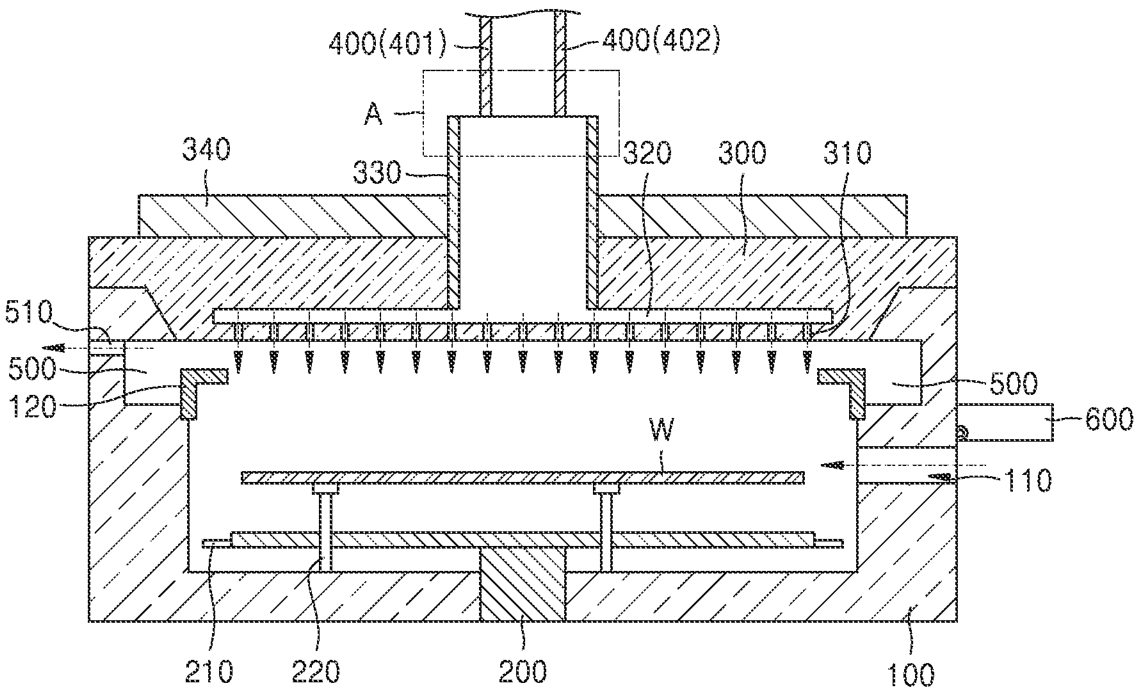
FIG. 1 is a cross-sectional view of a semiconductor process chamber according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of", when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

As the disclosure allows for various changes and numerous embodiments, example embodiments will be illustrated in the drawings and described in detail in the written description. However, this is not intended to limit the disclosure to specific example embodiments, and should be understood to include all conversions, equivalents, or substitutes included in the spirit and scope of the disclosure. In describing the disclosure, even when shown in different embodiments, the same reference numerals are used for the same elements.

Hereinafter, example embodiments will be described with reference to the accompanying drawings, wherein like reference numerals refer to like elements throughout and a repeated description thereof is omitted.

In an example embodiment below, terms, such as "first" and "second", are used herein merely to describe a variety of elements, but the elements are not limited by the terms. Such terms are used only for the purpose of distinguishing one element from another element.

In an example embodiment below, an expression used in the singular encompasses the expression of the plural, unless it has a clearly different meaning in the context.

In an example embodiment below, terms, such as "include" or "comprise", may be construed to denote a certain characteristic or element, or a combination thereof, but may not be construed to exclude the existence of or a possibility of addition of one or more other characteristics, elements, or combinations thereof.

Sizes of elements in the drawings may be exaggerated or reduced for convenience of explanation. For example, since sizes and thicknesses of elements in the drawings are arbitrarily illustrated for convenience of explanation, the disclosure is not limited thereto.

When an example embodiment may be implemented differently, a certain process order may be performed differently from the described order. For example, two consecutively described processes may be performed substantially at the same time or performed in an order opposite to the described order.

Terms used in this disclosure are only used to describe specific embodiments, and are not intended to limit the disclosure. In the disclosure, it should be understood that the terms "comprise", "include", or "have" are intended to designate that there is a feature, number, step, operation, element, component, or combination thereof described in the disclosure, but the presence or addition of one or more other features, numbers, steps, operations, elements, components, or combinations thereof is not precluded.

Hereinafter, a semiconductor process chamber according to an example embodiment of the disclosure is described with reference to FIG. 1.

FIG. 1 is a cross-sectional view of a semiconductor process chamber according to an example embodiment of the disclosure.

Referring to FIG. 1, the semiconductor process chamber according to an example embodiment of the disclosure includes a chamber 100 in which a wafer W is accommodated and the wafer W is processed, a heater 200 disposed below the wafer inside the chamber 100 to heat the wafer W, and a shower head 300 disposed on an upper side of the chamber 100 and including a plurality of nozzles 310.

The heater 200 is accommodated inside the chamber 100. The heater 200 may be capable of moving up and down and rotating by a driving unit. The wafer W may be arranged above the heater 200. The wafer W may be inserted into the chamber 100 through a wafer supply unit 110 that is opened. The inserted wafer W may be seated on an upper side of the plurality of lift pins 220 arranged in the heater 200. The lift pins 220 are arranged to pass through the heater 200 and may move the wafer W seated on the lift pins 220 while moving up and down together with the heater 200.

A heater edge ring 210 may be arranged in a circumferential direction of a side surface of the heater 200. A door 600 may be arranged at a portion where the wafer supply unit 110 is located. The door 600 closes the wafer supply unit 110 after the wafer W is supplied into the chamber 100, so that a deposition process may proceed inside the chamber 100. According to the example embodiment, the heater 200 may be a coil chuck heater capable of ensuring temperature uniformity on the entire surface of the wafer.

The shower head 300 may be arranged on the upper side of the chamber 100. In the shower head 300, the plurality of nozzles 310 may be arranged toward the inside of the chamber 100. The plurality of nozzles 310 may spray the supplied gas in the direction where the wafer W is located while forming a certain distance from each other.

The shower head 300 may include a nozzle supplier 320 arranged at a position corresponding to the plurality of nozzles 310 and supplying gas to the plurality of nozzles 310, and a connection portion 330 connecting the nozzle supplier 320 to a gas supplier 400 to be described later.

The supplier 320 may refer to a cylindrical space having a relatively small thickness. In addition, a passage, such as a barrier rib or a hole, may be formed in a space of the supplier 320 to uniformly supply the gas supplied to the supplier 320 to the plurality of nozzles 310. The gas supplied to the corresponding space may be introduced, and the introduced gas may be sprayed into the inner space of the chamber through the plurality of nozzles 310. The nozzle supplier 320 may serve as a buffer for uniformly spraying gases through the plurality of nozzles 310.

Gas supplied to the gas supplier 400 may be introduced into the connection portion 330. The connection portion 330 may be formed between the gas supplier 400 and the nozzle supplier 320 to transfer gas supplied from the gas supplier 400 to the nozzle supplier 320.

According to the example embodiment, the gas supplier 400 may be connected to the connection portion 330 to supply reaction gas to the connection portion 330. The gas supplier 400 may include a first gas supplier 401 supplying a first gas and a second gas supplier 402 supplying a second gas. For example, the first gas may be a source gas and the second gas may be a reactant gas. The gas introduced through the gas supplier 400 may be mixed in the inner space inside of the connection portion 330 and sprayed onto the wafer W through the plurality of nozzles 310. In the example embodiment, two gas suppliers have been described as an example. However, the disclosure is not limited thereto, and the embodiment may be applied when three or more gas suppliers are formed.

Hereinafter, a gas supplier according to embodiments of the disclosure is described with reference to FIGS. 2 to 7.

Figure 2:
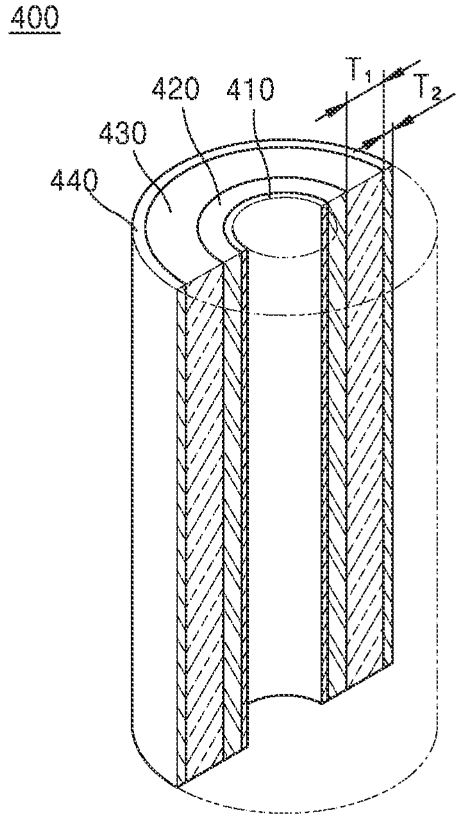
FIG. 2 is a perspective view illustrating a gas supply unit including a first layer according to an example embodiment.
Figure 3:
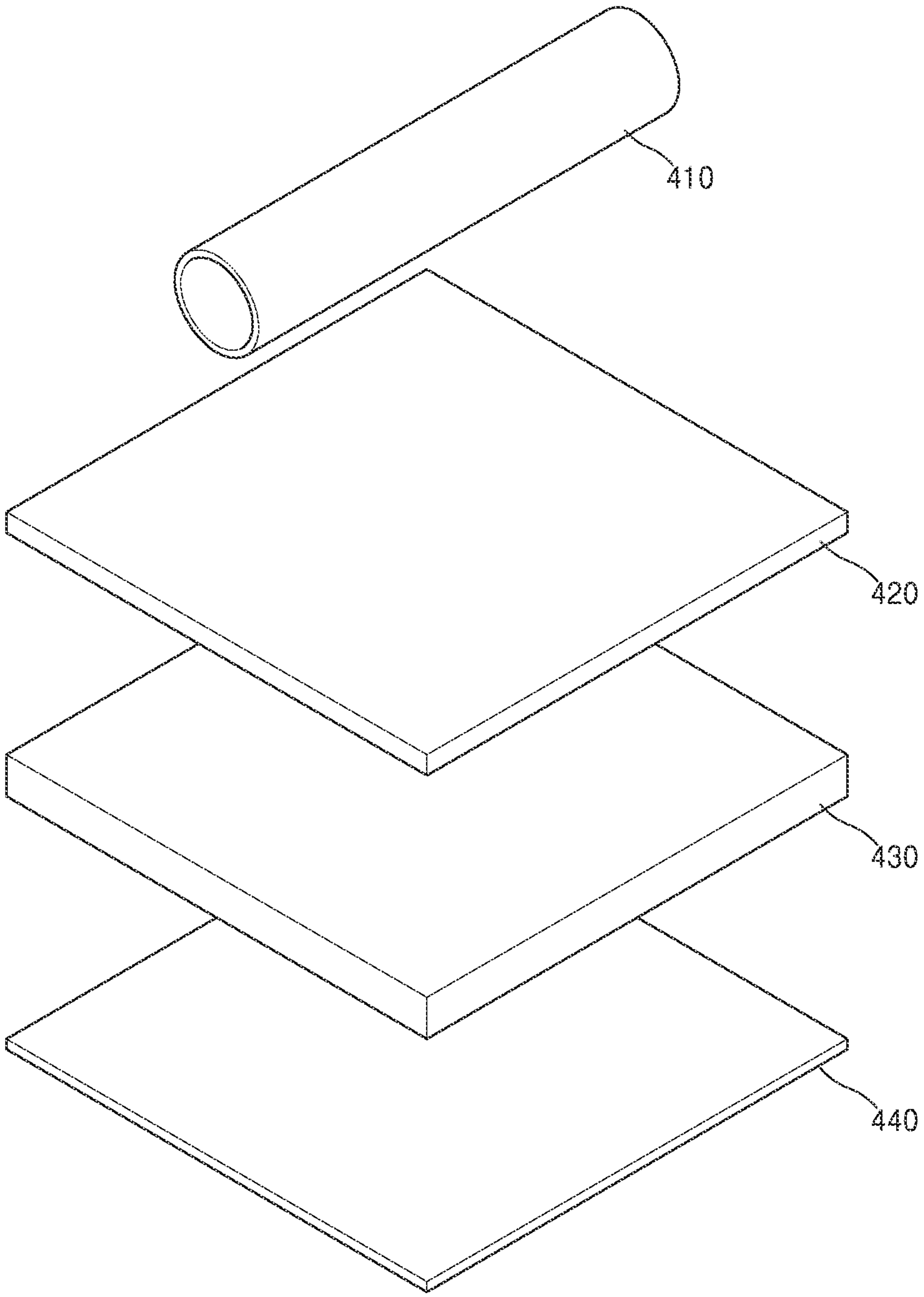
FIG. 3 is an exploded perspective view of the gas supply unit of FIG. 2.
Figure 4:
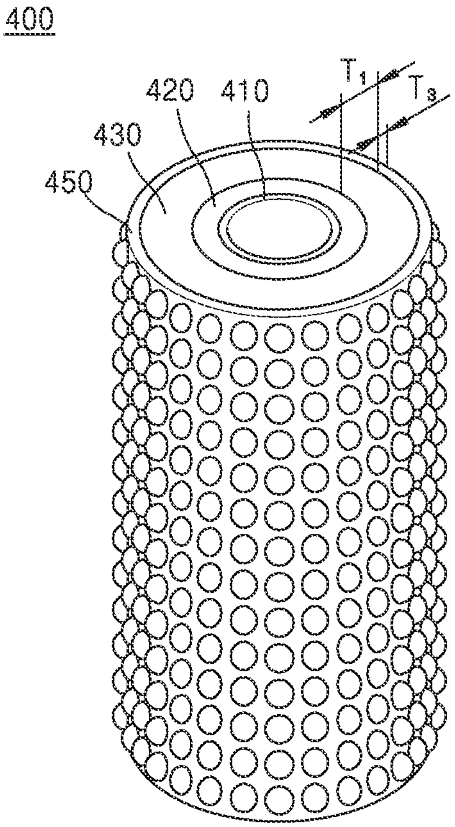
FIG. 4 is a perspective view illustrating a gas supply unit including a second layer according to another example embodiment.
Figure 5:
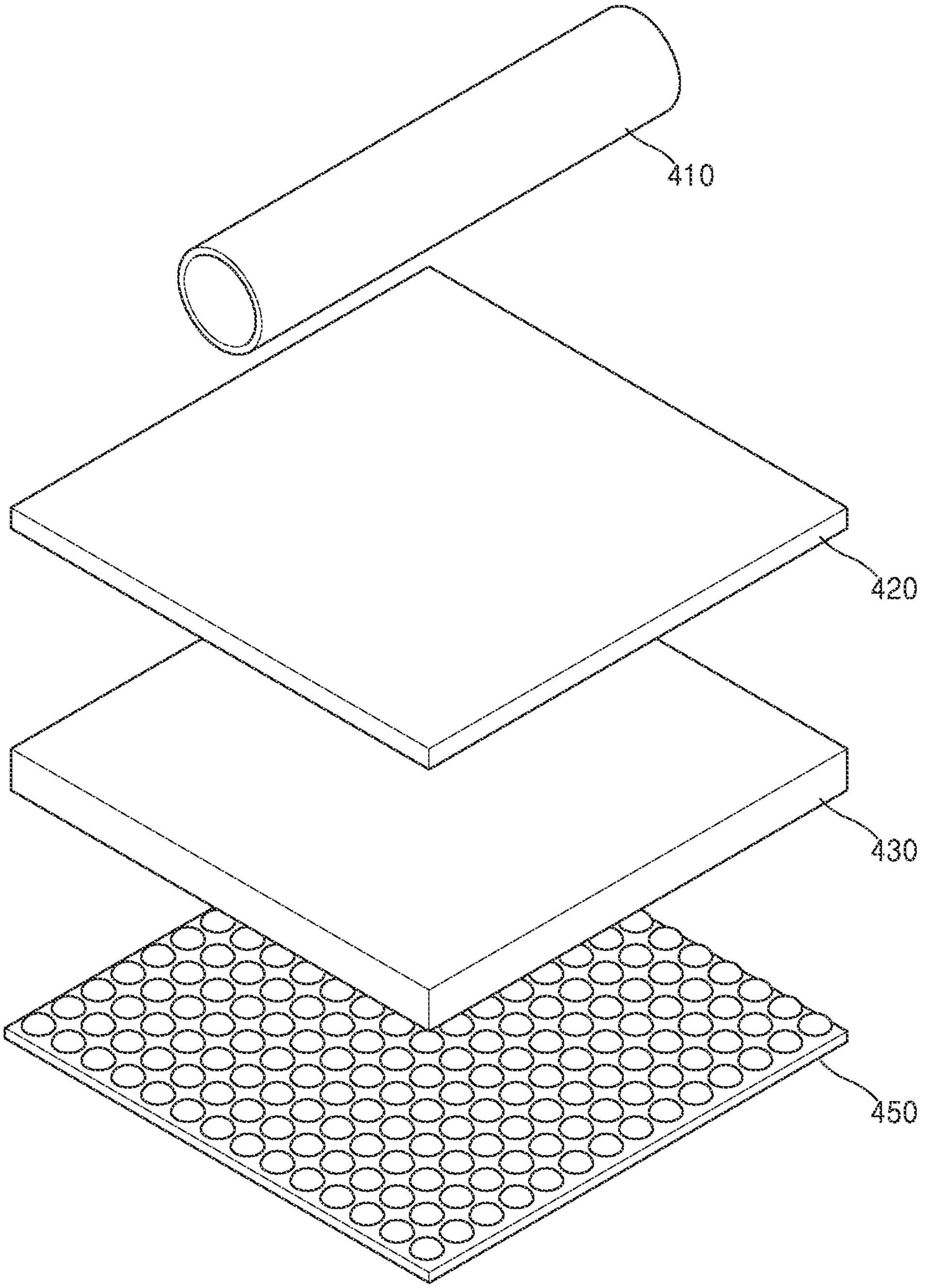
FIG. 5 is an exploded perspective view of the gas supply unit of FIG. 4.
Figure 6:
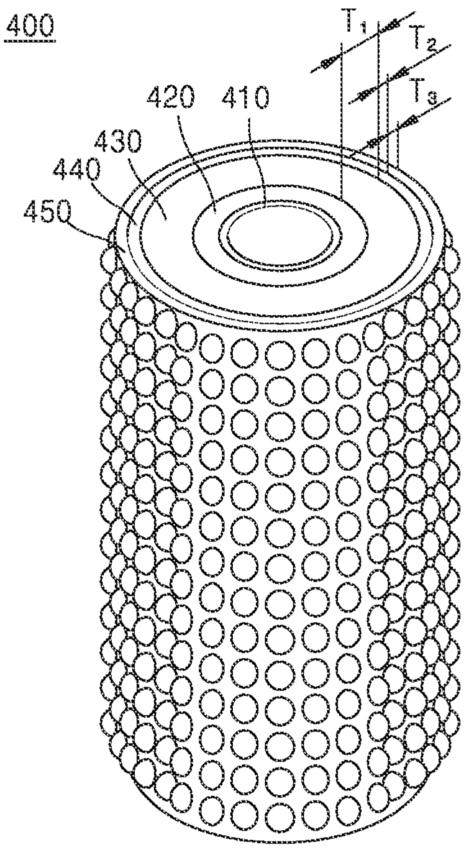
FIG. 6 is a perspective view illustrating a gas supply unit including a first layer and a second layer according to an example embodiment.
Figure 7:
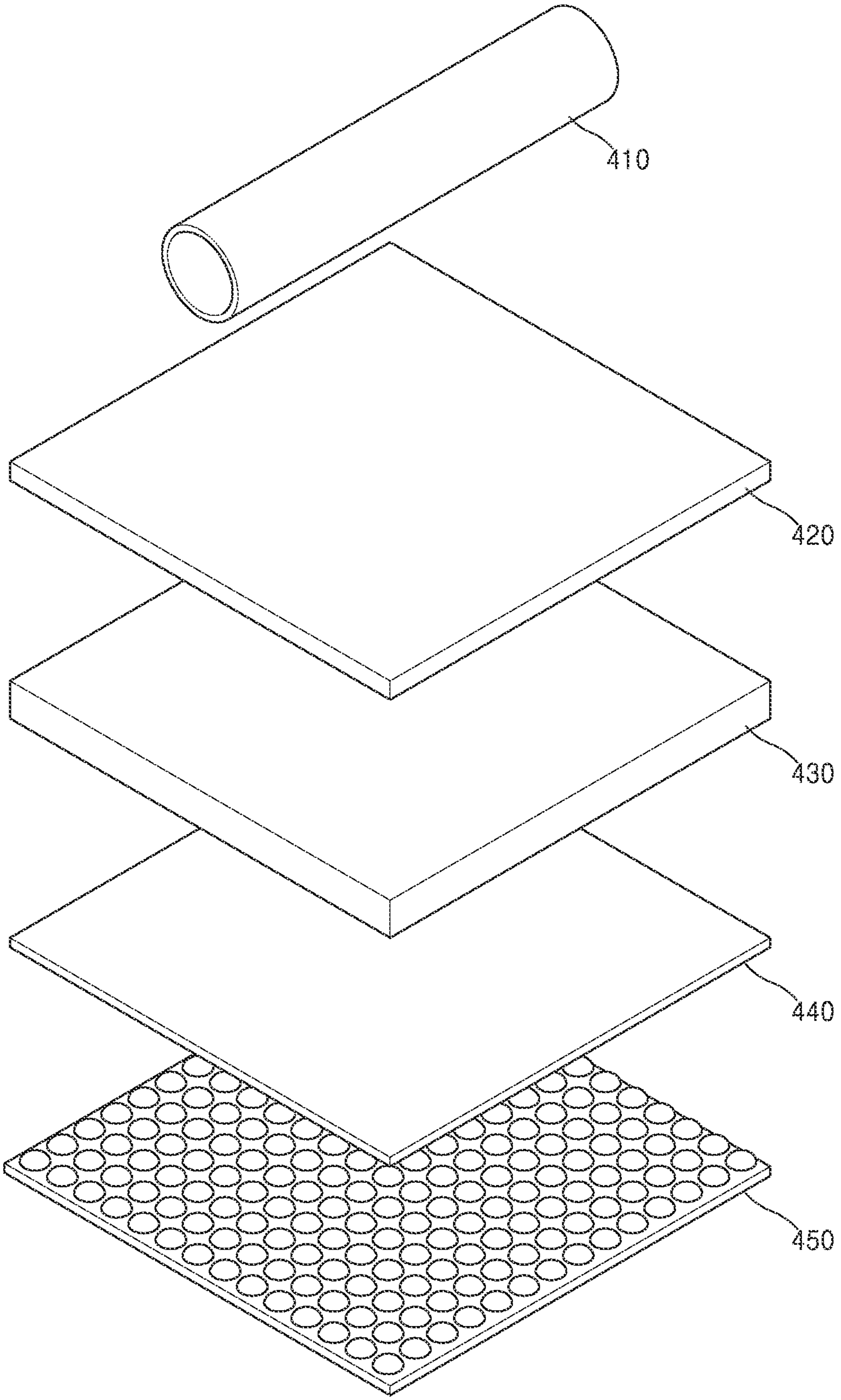
FIG. 7 is an exploded perspective view of the gas supply unit of FIG. 6.

FIG. 2 is a perspective view illustrating a gas supplier including a first layer according to an example embodiment of the disclosure. FIG. 3 is an exploded perspective view of the gas supplier of FIG. 2. FIG. 4 is a perspective view illustrating a gas supplier including a second layer according to another embodiment of the disclosure. FIG. 5 is an exploded perspective view of the gas supplier of FIG. 4. FIG. 6 is a perspective view illustrating a gas supplier including a first layer and a second layer according to another embodiment of the disclosure. FIG. 7 is an exploded perspective view of the gas supplier of FIG. 6.

Referring to FIGS. 2 to 7, the gas supplier 400 according to an example embodiment of the disclosure may include a gas line 410, a gas line cover 420 surrounding and provided adjacent to the gas line 410, a heating jacket 430 surrounding and provide adjacent to the gas line cover 420, and heating jacket covers 440 and 450 covering and provided adjacent to the heating jacket 430. In this case, the heating jacket covers 440 and 450 may include a first layer 440 surrounding the heat jacket 430.

The gas line 410 may include a gas pipe. The gas line 410 may supply gas supplied to the chamber 100 to the inside of the connection portion 330 of the shower head 300. For example, the gas pipe may be formed of a stainless steel (SUS) material having heat resistance and corrosion resistance suitable for high-temperature pipe.

The gas line cover 420 may be formed to surround the gas line 410. The gas line cover 420 may be arranged between the heating jacket 430 and the gas line 410 to supply heat generated from the heating jacket 430 to the gas line 410. For example, the gas line cover 420 may be formed of an aluminum block, so that heat generated from the heating jacket 430 may be evenly distributed to the gas line 410. Through this, the gas line 410 may receive heat uniformly from the heating jacket 430 to uniformly heat the gas flowing through the gas line 410.

The heating jacket 430 has a structure in which a heating wire is disposed therein. When the heating jacket 430 is driven, heat is generated from the heating jacket 430 through the heating wire, and the generated heat may be transferred to the gas line 410 through the gas line cover 420. The heating jacket 430 is formed of rubber or textured material and may uniformly discharge heat generated from the heating wire to the outside.

According to the example embodiment, the heating jacket covers 440 and 450 surrounding the heating jacket 430 may be included. The heating jacket covers 440 and 450 are formed to surround the heating jacket 430 to prevent heat generated in the heating jacket 430 from escaping to an outer region of the gas supplier 400 and reducing thermal efficiency. For example, the heat generated in the heating jacket 430 cannot escape to the outside due to the heating jacket covers 440 and 450 and may be transferred only to the gas line 410, so that the heating efficiency of the gas supplier 400 is increased, thereby increasing the heating efficiency of the gas supplier 400 and improving power consumption in the heating process.

In addition, by lowering an external surface temperature of the gas supplier 400 through the heating jacket covers 440 and 450, the heat dissipated through the heating jacket 430 may increase temperatures of electronic equipment arranged adjacent to the gas supplier 400, thereby preventing the possibility of deteriorating driving efficiency of the electronic equipment. For example, the heating jacket covers 440 and 450 are arranged to cover the outer surface of the heating jacket 430, and as a result, the surface temperature of the gas supplier 400 is lowered, thereby improving the temperature environment around the gas supplier 400 and ensuring reliability of peripheral electronic equipment.

In this way, thermal efficiency is increased through the heating jacket covers 440 and 450 and work reliability of electronic equipment around the gas supplier 400 may be improved.

FIGS. 2 and 3 show a structure of a gas supplier including a first layer according to an example embodiment of the disclosure.

Referring to FIGS. 2 and 3, the heating jacket cover 440 according to an example embodiment of the disclosure may include the first layer 440. In this case, the first layer 440 may be formed of a heat reflection coating layer. The heat reflection coating layer 440 is formed to surround the outside of the heating jacket 430 and has an insulating property, so that heat generated in the heating jacket 430 may be prevented from being discharged to the outside.

A thickness T2 of the heat reflection coating layer 440 in a horizontal direction according to the example embodiment may be less than or equal to 10% of a thickness T1 of the heating jacket 430 in the horizontal direction. For example, when the thickness of the heating jacket 430 is about 10 mm, the thickness of the heat reflection coating layer 440 may be less than or equal to 1 mm. When the thickness T2 of the heat reflection coating layer 440 exceeds 10% of the thickness T1 of the heating jacket 430, the gas supplier 400 becomes thicker and larger in size, thereby increasing a size of the entire equipment. In addition, referring to FIG. 1, the thickness of the gas supplier 400 may be too thick and a distance between the first gas supplier 401 and the second gas supplier 402 may be considerably narrowed, making it difficult to maintain the gas suppliers.

FIGS. 4 and 5 show a structure of a gas supplier including a second layer according to another example embodiment of the disclosure.

FIG. 4 is a perspective view illustrating a gas supplier including a second layer according to another embodiment of the disclosure. FIG. 5 is an exploded perspective view of the gas supplier of FIG. 4.

Referring to FIGS. 4 and 5, the heating jacket cover 450 according to another example embodiment of the disclosure may include a second layer 450. In this case, the second layer 450 may be formed of an air pocket layer 450. The air pocket layer 450 is formed on the outside of the heating jacket 430 and provides insulation through the air space inside the air pocket to prevent heat generated in the heating jacket 430 from being discharged to the outside.

A thickness T3 of the air pocket layer 450 according to the example embodiment may be greater than or equal to 20% or and less than or equal to 50% of the thickness T1 of the heating jacket 430. When the thickness T3 of the air pocket layer 450 is less than 20% of the thickness T1 of the heating jacket 430, the thermal efficiency of the gas supplier 400 is reduced due to a decrease in thermal insulation performance, and electronic devices around the gas supplier 400 may deteriorate.

For example, when the thickness of the heating jacket 430 is 10 mm, the thickness of the air pocket layer 450 may be formed in the range of 2 mm to 5 mm. When the thickness T3 of the air pocket layer 450 exceeds 50% of the thickness T1 of the heating jacket 430, the thickness T3 of the air pocket layer 450 may become too thick, and a size of the air pocket layer 450 may increase, resulting in a problem in that the overall equipment size increases. In addition, when the thickness T3 of the air pocket layer 450 exceeds 50% of the thickness T1 of the heating jacket 430, the durability of the air pocket layer 450, that is, the possibility of damage or breakage, increases, so that a problem in reliability of the air pocket layer 450 may occur.

FIGS. 6 and 7 show a structure of a gas supplier including a first layer and a second layer according to another example embodiment of the disclosure.

FIG. 6 is a perspective view illustrating a gas supplier including a first layer and a second layer according to another example embodiment of the disclosure. FIG. 7 is an exploded perspective view of the gas supplier of FIG. 6.

Referring to FIGS. 6 and 7, the heating jacket covers 440 and 450 according to another example embodiment of the disclosure may include a first layer 440 and a second layer 450 surrounding the first layer. In this case, the first layer 440 may be formed of the heat reflection coating layer 440, and the second layer 450 may be formed of the air pocket layer 450.

The heat reflection coating layer 440 is formed to surround the outside of the heating jacket 430, and the air pocket layer 450 is formed to surround the outside of the heat reflection coating layer 440. At this time, both the heat reflection coating layer 440 and the air pocket layer 450 have insulating properties, so that heat generated in the heating jacket 430 may be further prevented from being discharged to the outside in two stages.

The thickness T2 of the heat reflection coating layer 440 according to the example embodiment may be less than or equal to 10% of the thickness T1 of the heating jacket 430, and the thickness T3 of the air pocket layer 450 may be greater than or equal to 20% and less than or equal to 50% of the thickness T1 of the heating jacket 430. At this time, the thickness T2 of the heat reflection coating layer 440 may be formed to be smaller than the thickness T3 of the air pocket layer 450. Because the air pocket layer 450 requires an air pocket, which is a space into which air is inserted, the thermal insulation efficiency may be ensured only when the air pocket layer 450 is formed relatively thicker than the heat reflection coating layer 440 formed by coating.

Hereinafter, example embodiments of the heating jacket cover including the first layer are described with reference to FIGS. 8 and 9.

Figure 8:
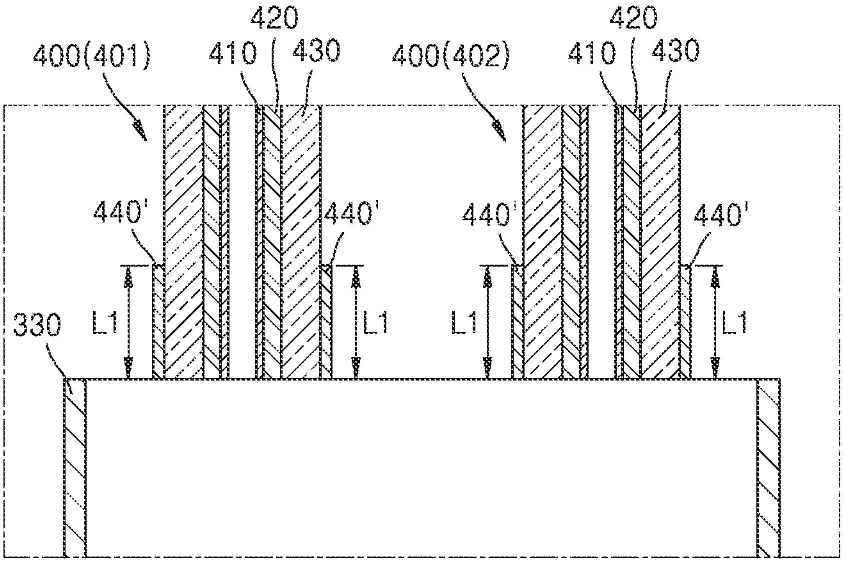
FIG. 8 is an enlarged view of region A of FIG. 1, illustrating a state in which a first layer surrounds a portion of a heating jacket connected to a connecting portion.

FIG. 8 is an enlarged view of region A of FIG. 1, showing a state in which the first layer surrounds a portion of a heating jacket connected to a connection portion. FIG. 9 is an enlarged view of region A of FIG. 1, showing a state in which the thickness of the first layer increases in a direction toward the connection portion.

Referring to FIG. 8, in the example embodiment, the first layer 440' may be formed to surround a portion of the heating jacket 430 connected to the connection portion 330. In this case, the first layer 440' may be formed to have a first length L1. As the gas supplier 400 approaches the connection portion 330 connected to the chamber 100, an appropriate temperature of the gas supplied to the chamber 100 must be ensured. Therefore, as the gas supplier 400 approaches the connection portion 330, the insulation performance and thermal efficiency need to be increased.

Accordingly, as in the example embodiment, by forming the first layer 440' to surround only a portion of the heating jacket 430 so as to be connected to the connection portion 330, the gas supplied to the connection portion 330 may receive heat for forming an appropriate temperature without loss at a portion close to the chamber 100, and thus, the temperature of the gas supplied to the chamber 100 may be maintained at an appropriate level. At this time, the first length L1 of the first layer 440' may be adjusted at an appropriate level of length in consideration of the thermal efficiency of the heating jacket 430 with respect to the gas line 410 and the degree of heat dissipation to the outside of the heating jacket 430.

Figure 9:
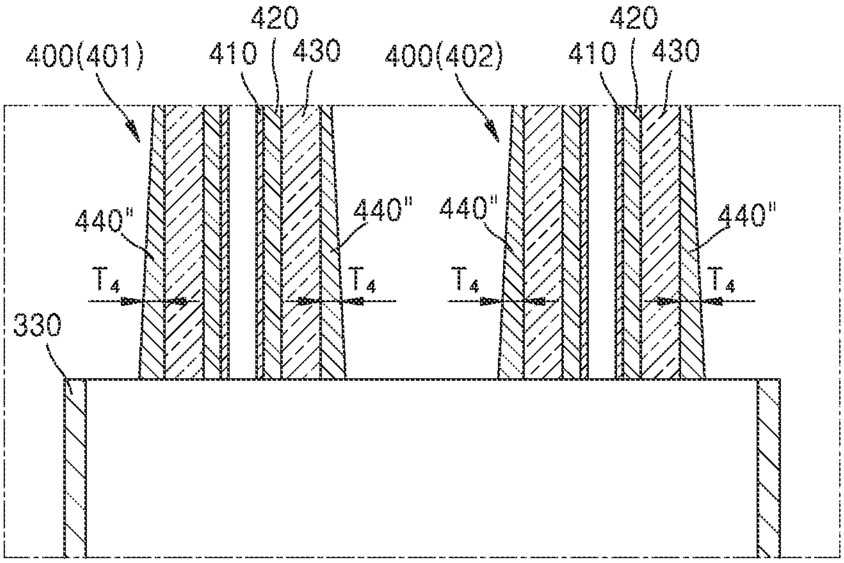
FIG. 9 is an enlarged view of region A of FIG. 1, illustrating a state in which a thickness of the first layer increases in a direction in which the connection portion is located.

Referring to FIG. 9, in the example embodiment, a thickness T4 of the first layer 440" in the horizontal direction may increase in the direction toward the connection portion 330. As the gas supplier 400 approaches the connection portion 330 connected to the chamber 100, an appropriate temperature of the gas supplied to the chamber 100 must be ensured. Therefore, as the gas supplier 400 approaches the connection portion 330, the insulation performance and thermal efficiency need to be increased. Accordingly, as in the example embodiment, based on the thickness T4 of the first layer 440" to increase as the first layer 440" approaches the connection portion 330, the thermal insulation performance is improved in the direction where toward the connection portion 330 in response to the increase in thickness, and thus, the temperature of the gas supplied to the chamber 100 may be maintained at an appropriate level.

In this case, the thickness of the thickest portion of the first layer 440" may be less than twice the thickness of the thinnest portion of the first layer 440". When the thickness of the thickest portion of the first layer 440" is more than twice the thickness of the thinnest portion, a distance between the first gas supplier 401 and the second gas supplier 402 is narrowed and the maintenance of the corresponding portion may be difficult.

In addition, due to a difference in thickness of each location of the gas supplier 400, the temperature uniformity characteristic of the gas supplied from a thermal gradient side may be deteriorated. For example, the temperature uniformity of the gas supplied to the thinnest portion, the thickest portion, and the connection portion of the gas supplier 400 may be deteriorated.

Hereinafter, example embodiments of a heating jacket cover including a second layer according to another example embodiment of the disclosure are described with reference to FIGS. 10 and 11.

Figure 10:
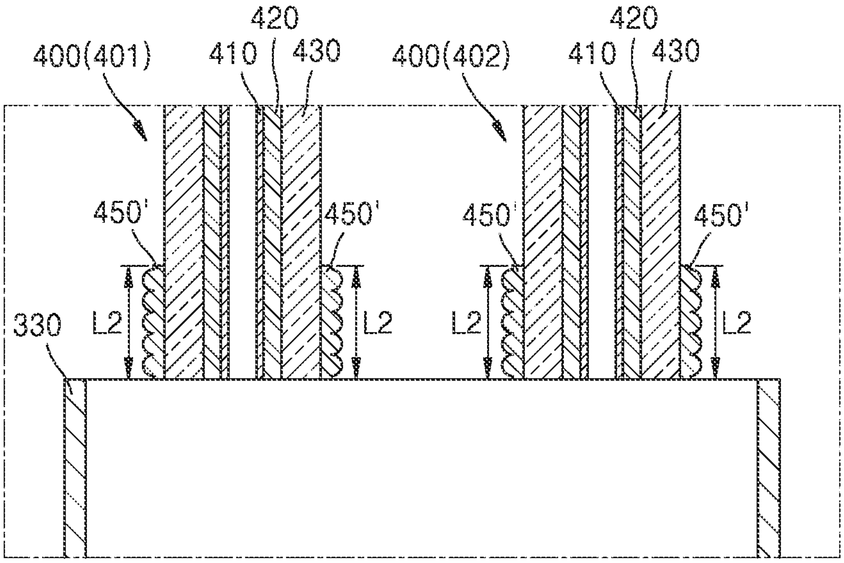
FIG. 10 is an enlarged view of region A of FIG. 1, illustrating a state in which a second layer surrounds a portion of a heating jacket connected to the connection portion.

FIG. 10 is an enlarged view of region A of FIG. 1, showing a state in which the second layer surrounds a portion of the heating jacket connected to the connection portion. FIG. 11 is an enlarged view of region A of FIG. 1, showing a state in which a thickness of the second layer increases in the direction toward the connection portion.

Referring to FIG. 10, in the example embodiment, the second layer 450' may be formed to surround a portion of the heating jacket 430 connected to the connection portion 330. In this case, the second layer 450' may be formed to have a second length L2. As the gas supplier 400 approaches the connection portion 330 connected to the chamber 100, an appropriate temperature of the gas supplied to the chamber 100 may need to be ensured. Therefore, as the gas supplier 400 approaches the connection portion 330, the insulation performance and thermal efficiency need to be increased. Accordingly, as in the example embodiment, by forming the second layer 450' to surround only a portion of the heating jacket 430 so as to be connected to the connection portion 330, the gas supplied to the connection portion 330 may receive heat to form an appropriate temperature without loss at a portion close to the chamber 100, and thus, the temperature of the gas supplied to the chamber 100 may be maintained at an appropriate level. At this time, the second length L2 of the second layer 450' may be adjusted at an appropriate level of length in consideration of the thermal efficiency of the heating jacket 430 for the gas line 410 and the degree of heat dissipation from the heating jacket 430 to the outside.

Figure 11:
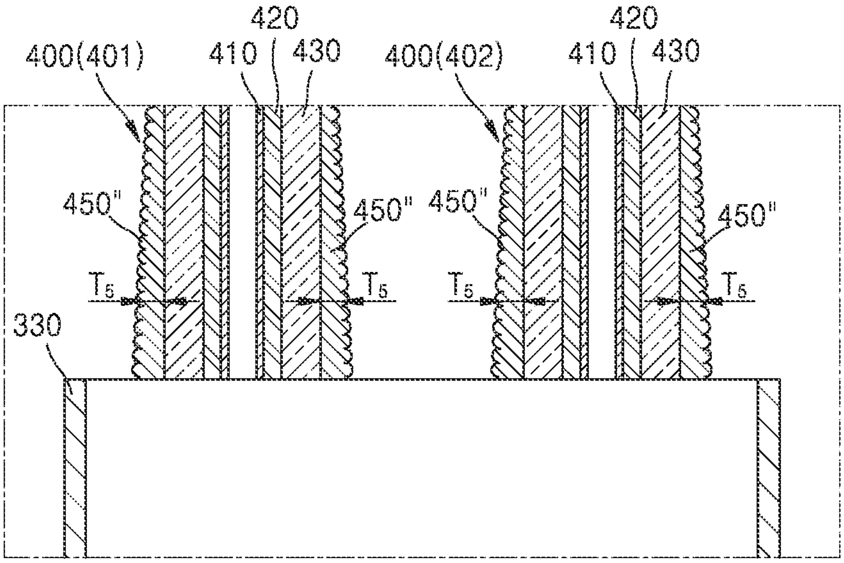
FIG. 11 is an enlarged view of region A of FIG. 1, illustrating a state in which a thickness of the second layer increases in the direction in which the connection portion is located.

Referring to FIG. 11, in the example embodiment, a thickness T5 of the second layer 450" may increase in the direction in which the connection portion 330 is located. As the gas supplier 400 approaches the connection portion 330 connected to the chamber 100, an appropriate temperature of the gas supplied to the chamber 100 must be ensured. Therefore, as the gas supplier 400 approaches the connection portion 330, the insulation performance and thermal efficiency may need to be increased. Accordingly, as in the example embodiment, based on the thickness T5 of the second layer 450" increasing as the gas supplier 400 approaches the connection portion 330, the thermal insulation performance may be improved in the direction toward the connection portion 330, and thus, the temperature of the gas supplied to the chamber 110 may be maintained at an appropriate level.

In this case, a thickness of the thickest portion of the second layer 450" may be less than twice a thickness of the thinnest portion. When the thickness of the thickest portion of the second layer 450" is more than twice the thickness of the thinnest portion, a distance between the first gas supply portion 401 and the second gas supply portion 402 is narrowed and the maintenance of the corresponding portion may be difficult.

In addition, due to the difference in thickness of each position of the gas supplier 400, the temperature uniformity characteristic of the gas supplied from the thermal gradient side may be deteriorated. For example, the temperature uniformity of the gas supplied to the thinnest portion, the thickest portion, and the connection portion of the gas supplier 400 may be deteriorated.

According to the example embodiment, an area occupied by the air pocket per unit area may increase in the second layer 450" toward the direction in which the connection portion 330 is located. Therefore, as the area of the air pocket of the second layer 450" increases in the direction toward the connection portion 330, the insulation performance of the gas supplier 400 may also be improved to maintain the temperature of the gas supplied to the chamber 100 at an appropriate level.

Hereinafter, example embodiments of a heating jacket cover including a first layer and a second layer according to another example embodiment of the disclosure are described with reference to FIGS. 12 and 13.

Figure 12:
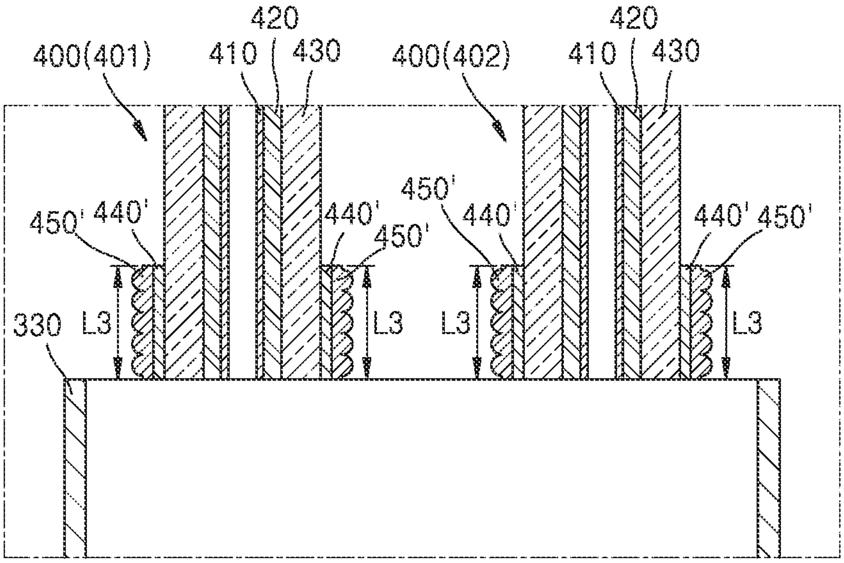
FIG. 12 is an enlarged diagram of region A of FIG. 1, illustrating a state in which the first layer and the second layer surround a portion of the heating jacket connected to the connected portion.

FIG. 12 is an enlarged view of region A of FIG. 1, showing a state in which a first layer and a second layer surround a portion of a heating jacket connected to a connection portion. FIG. 13 is an enlarged view of region A of FIG. 1, showing a state in which thicknesses of the first layer and the second layer increase toward the direction where the connection portion is located.

Referring to FIG. 12, in this example embodiment, the first layer 440' and the second layer 450' may be formed to surround a portion of the heating jacket 430 connected to the connection portion 330. In this case, the first layer 440' and the second layer 450' may be formed to have a third length L3. In FIG. 12, the first layer 440' and the second layer 450' are shown to have the same length, but the first layer 440' and the second layer 450' may have different lengths. As the gas supplier 400 approaches the connection portion 330 connected to the chamber 100, an appropriate temperature of the gas supplied to the chamber 100 may need to be ensured. Therefore, as the gas supplier 400 approaches the connection portion 330, the insulation performance and thermal efficiency may need to be increased. Accordingly, as in the example embodiment, by allowing the first layer 440' and the second layer 450' to surround only a portion of the heating jacket 430 so as to be connected to the connection portion 330, the gas supplied to the connection portion 330 may receive heat for forming an appropriate temperature without loss at a portion close to the chamber 100, and thus, the temperature of the gas supplied to the chamber 100 may be maintained at an appropriate level. At this time, the third length L3 of the first layer 440' and the second layer 450' may be adjusted to an appropriate level of length in consideration of the thermal efficiency of the heating jacket 430 with respect to the gas line 410 and the degree of dissipation to the outside of the heating jacket 430.

Figure 13:
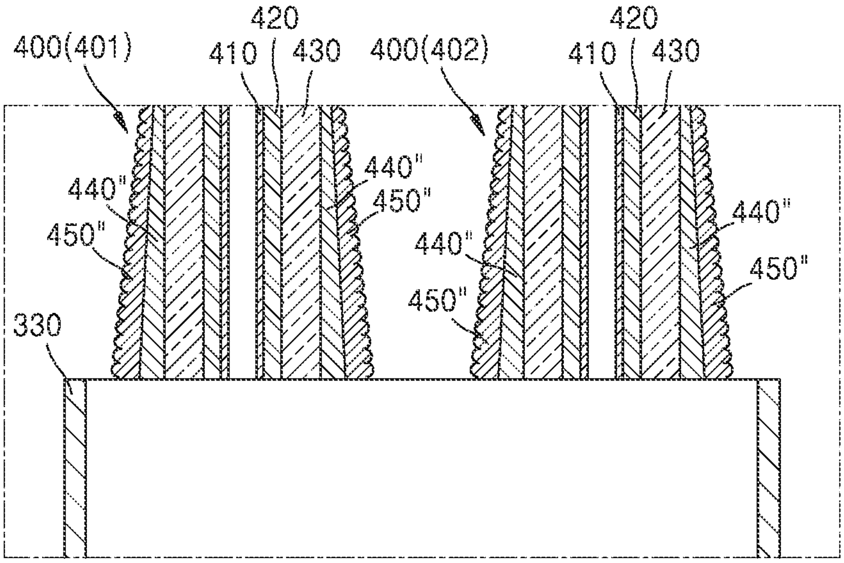
FIG. 13 is an enlarged view of region A of FIG. 1, illustrating a state in which thicknesses of the first layer and the second layer increase toward the direction in which the connection portion is located.

Referring to FIG. 13, in the example embodiment, a thickness T6 of the first layer 440" and the second layer 450" may increase in a direction toward the connection portion 330. As the gas supplier 400 approaches the connection portion 330 connected to the chamber 100, an appropriate temperature of the gas supplied to the chamber 100 must be ensured. Therefore, as the connection portion 330 is approached, the insulation performance and thermal efficiency may need to be increased. Accordingly, as in the example embodiment, based on the thicknesses T6 of the first layer 440" and the second layer 450" increasing as the first layer 440" and the second layer 450" get closer to the connection portion 330, the thermal insulation performance may be improved in which the connection portion 330 is located in response to the increase in thickness, and thus, the temperature of the gas supplied to the chamber 100 may be maintained at an appropriate level. At this time, a rate of increase in the thicknesses of the first layer 440" and the second layer 450" toward the connection portion 330 may not be proportional but may increase at a different rate. In addition, the thicknesses of the first layer 440" and the second layer 450" may increase as only one of the first layer 440" and the second layer 450" gets closer to the connection portion 330.

In this case, based on the sum of the thicknesses of the first layer 440" and the second layer 450", a thickness of the thickest portion may be less than a thickness of the thinnest portion. Based on the sum of the thicknesses of the first layer 440" and the second layer 450", when the thickness of the thickest portion exceeds twice the thickness of the thinnest portion, the first gas supplier 401 and the second gas supplier 402 is narrowed, and it may difficult to maintain the corresponding portion.

In addition, due to the difference in thickness of each location of the gas supplier 400, the temperature uniformity characteristic of the gas supplied from the thermal gradient side may be deteriorated. For example, the temperature uniformity of the gas supplied to the thinnest portion, the thickest portion, and the connection portion of the gas supplier 400 may be deteriorated.

According to the example embodiment, an area occupied by the air pocket per unit area may increase in the second layer 450" toward the direction in which the connecting portion 330 is located. Therefore, as an area of the air pocket of the second layer 450" increases in the direction toward the connection portion 330, the insulation performance of the second layer 450" may also be improved to maintain the temperature of the gas supplied to the chamber 100 at an appropriate level.

As such, the disclosure is described with reference to the embodiments shown in the drawings, but this is only an example. Those skilled in the art can fully understand that various modifications and equivalent other embodiments are possible from the embodiments. Therefore, the true technical protection scope of the disclosure should be determined based on the appended claims and their equivalents.

Specific technical details described in the embodiments are examples, and do not limit the technical scope of the embodiments. In order to briefly and clearly describe the detailed description of the disclosure, descriptions of related-art general techniques and configurations may be omitted. In addition, the connection of lines or connection members between the elements shown in the drawings is an example of functional connection and/or physical or circuit connection, which can be replaced in an actual device or additional various functional connections, physical connections, or circuit connections. In addition, when there is no specific reference, such as "essential" or "significant", it may not necessarily be an element necessary for the application of the disclosure.

"The" or similar designations described in the description and claims of the disclosure may refer to both singular and plural, unless otherwise specifically limited. In addition, when a range is described in an embodiment, the range includes embodiments in which individual values belonging to the range are applied (unless there is no description to the contrary), and is the same as each individual value included in the range is described in the detailed description of the disclosure. In addition, when there is a clear description or a description to the contrary of the order of operations included in the method according to an embodiment, the operations may be performed in an appropriate order. Embodiments are not necessarily limited according to the order of description of the operations.

In the semiconductor process chamber according to the embodiments of the disclosure, the thermal efficiency of a heating jacket may be improved through a heating jacket cover unit arranged to surround the heating jacket, and an external environment of a gas supplier may be improved by lowering a surface temperature of the gas supplier.

Effects of the disclosure are not limited to the effects described above, and other effects not described herein will be clearly understood by those skilled in the art from the claims.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope of the disclosure as defined by the following claims and their equivalents.

What is claimed is:

1. A semiconductor process chamber comprising:

a chamber configured to accommodate a wafer; and a shower head on an upper side of the chamber and comprising a plurality of nozzles;

wherein the shower head comprises a gas supplier configured to supply gas to the shower head, and wherein the gas supplier comprises:

a gas line;

a heating jacket on the gas line; and a heating jacket cover on the heating jacket, wherein the heating jacket cover comprises a first layer on the heating jacket, and wherein a thickness of the first layer in a radial direction of the gas supplier increases in an axial direction of the gas supplier toward the chamber.

2. The semiconductor process chamber of claim 1, wherein the first layer comprises a heat reflection coating layer.

3. The semiconductor process chamber of claim 2, wherein the shower head further comprises a connection portion configured to supply gas supplied from the gas supplier to a nozzle supplier, wherein the gas supplier is connected to the connection portion, and wherein the first layer is on a portion of the heating jacket connected to the connection portion.

4. The semiconductor process chamber of claim 2, wherein the shower head further comprises a connection portion configured to supply gas supplied from the gas supplier to a nozzle supplier, wherein the gas supplier is connected to the connection portion, and wherein the thickness of the first layer increases in a direction toward the connection portion.

5. The semiconductor process chamber of claim 2, wherein a thickness of the heat reflection coating layer is less than or equal to 10% of a thickness of the heating jacket.

6. The semiconductor process chamber of claim 1, wherein the heating jacket cover comprises a second layer on the heating jacket, and wherein the second layer comprises an air pocket layer.

7. The semiconductor process chamber of claim 6, wherein the shower head further comprises a connection portion configured to supply gas supplied from the gas supplier to a nozzle supplier, wherein the gas supplier is connected to the connection portion, and wherein the second layer is on a portion of the heating jacket connected to the connection portion.

8. The semiconductor process chamber of claim 6, wherein the shower head further comprises a connection portion configured to supply gas supplied from the gas supplier to a nozzle supplier, wherein the gas supplier is connected to the connection portion, and wherein a thickness of the second layer increases in a direction toward the connection portion.

9. The semiconductor process chamber of claim 6, wherein a thickness of the air pocket layer is greater than or equal to 20% or and less than or equal to 50% of a thickness of the heating jacket.

10. The semiconductor process chamber of claim 1, wherein the heating jacket cover comprises:

a second layer on the first layer, wherein the first layer comprises a heat reflection coating layer, and wherein the second layer comprises an air pocket layer.

11. The semiconductor process chamber of claim 10, wherein the shower head further comprises a connection portion configured to supply gas supplied from the gas supplier to a nozzle supplier, wherein the gas supplier is connected to the connection portion, and wherein the first layer and the second layer are on a portion of the heating jacket connected to the connection portion.

12. The semiconductor process chamber of claim 10, wherein the shower head further comprises a connection portion configured to supply gas supplied from the gas supplier to a nozzle supplier, wherein the gas supplier is connected to the connection portion, and wherein a thickness of the second layer increase in the axial direction of the gas supplier toward the connection portion.

13. The semiconductor process chamber of claim 1, further comprising a gas line cover between the heating jacket and the gas line.

14. The semiconductor process chamber of claim 13, wherein the gas line cover comprises an aluminum block.

15. The semiconductor process chamber of claim 1, wherein the heating jacket comprise a heating wire and rubber material or a textured material.

16. A semiconductor process chamber comprising:

a chamber configured to accommodate a wafer; and a shower head on an upper side of the chamber and comprising a plurality of nozzles;

wherein the shower head comprises a gas supplier configured to supply gas to the shower head, wherein the gas supplier comprises:

a gas line;

a heating jacket on the gas line; and a heating jacket cover on the heating jacket, wherein the heating jacket cover comprises:

a first layer on the heating jacket; and a second layer on the first layer, and wherein a thickness of the first layer in a radial direction of the gas supplier increases in an axial direction of the gas supplier toward the chamber.

17. The semiconductor process chamber of claim 16, wherein the first layer comprises a heat reflection coating layer, and wherein the second layer comprises an air pocket layer.

18. The semiconductor process chamber of claim 17, wherein the shower head further comprises a connection portion configured to supply gas supplied from the gas supplier to a nozzle supplier, wherein the gas supplier is connected to the connection portion, and wherein the first layer and the second layer are on a portion of the heating jacket connected to the connection portion.

19. The semiconductor process chamber of claim 17, wherein the shower head further comprises a connection portion configured to supply gas supplied from the gas supplier to a nozzle supplier, wherein the gas supplier is connected to the connection portion, and wherein a thickness of the second layer increase in the axial direction of the gas supplier toward the connection portion.

20. The semiconductor process chamber of claim 17, wherein a thickness of the air pocket layer is greater than or equal to 20% or and less than or equal to 50% of a thickness of the heating jacket.

* * * * *